United States Patent [19]

Shay

[11] Patent Number: 5,450,025

[45] Date of Patent: Sep. 12, 1995

[54] TRISTATE DRIVER FOR INTERFACING TO A BUS SUBJECT TO OVERVOLTAGE CONDITIONS

[75] Inventor: Michael J. Shay, Arlington, Tex.

[73] Assignee: National Semiconductor Corporation, Santa Clara, Calif.

[21] Appl. No.: 290,439

[22] Filed: Aug. 15, 1994

Related U.S. Application Data

[63] Continuation of Ser. No. 15,726, Feb. 10, 1993, abandoned.

[51] Int. Cl.⁶ .......................................... H03K 19/094
[52] U.S. Cl. ......................................... 326/81; 326/83
[58] Field of Search ............... 307/443, 451, 473, 475, 307/296.2, 296.5, 296.8; 326/80–83

[56] References Cited

U.S. PATENT DOCUMENTS

| | | | |
|---|---|---|---|
| 3,949,242 | 4/1976 | Hirasawa et al. | 307/205 |
| 4,583,203 | 4/1986 | Monk | 365/189 |
| 4,583,204 | 4/1986 | Takemae et al. | 365/226 |
| 4,670,668 | 6/1987 | Liu | 307/296 |
| 4,670,861 | 6/1987 | Shu et al. | 365/181 |
| 4,825,275 | 4/1989 | Tomassetti et al. | 357/43 |
| 4,862,240 | 8/1989 | Watanabe et al. | 357/42 |
| 4,864,373 | 9/1989 | Miyashita | 357/23.5 |
| 4,906,056 | 3/1990 | Taniguchi | 307/482 |
| 4,930,112 | 5/1990 | Tanaka et al. | 365/226 |
| 4,952,825 | 8/1990 | Yoshida | 307/475 |
| 4,961,010 | 10/1990 | Davis | 307/443 |
| 5,027,008 | 6/1991 | Runaidue | 307/443 |
| 5,036,222 | 7/1991 | Davis | 307/443 |
| 5,060,044 | 10/1991 | Tomassetti | 357/43 |
| 5,087,579 | 2/1992 | Tomassetti | 437/31 |
| 5,117,129 | 5/1992 | Hoffman et al. | 307/443 |
| 5,134,316 | 7/1992 | Ta | 307/475 |
| 5,160,855 | 11/1992 | Dobberpuhl | 307/443 X |
| 5,191,244 | 3/1993 | Runaldue et al. | 307/443 X |

FOREIGN PATENT DOCUMENTS

| | | |
|---|---|---|
| 0305676 | 8/1989 | European Pat. Off. |
| 0414354 | 2/1991 | European Pat. Off. |
| 0480201 | 4/1992 | European Pat. Off. |
| 91/08341 | 11/1991 | WIPO |

OTHER PUBLICATIONS

Paper entitled: "A Tidal Wave of 3-V ICs Opens Up Many Options" by Dave Bursky, published in Electronic Design, Aug. 20, 1992, pp. 37–47.

Article entitled: "Level Transistor Logic with no DC Power Dissipation" published in the International Technology Disclosure Journal 9:06 by Author unknown 104279.

Primary Examiner—David R. Hudspeth
Attorney, Agent, or Firm—H. Donald Nelson; Ken John Koestner; Richard Roddy

[57] ABSTRACT

A tristate driver interfaces a 3.3 volt digital circuit to a bus that supports both 3.3 and 5.0 volt digital signals. In one embodiment, the pullup circuit path includes a P-channel MOSFET which is backgated by a backgate voltage generator and gated by a gate voltage generator that receives its drive voltage from a comparator and is controlled by an enable circuit. The pulldown circuit path includes an N-channel MOSFET which is controlled by the enable circuit. Current leakage through the pullup circuit is minimized when overvoltage occurs on the bus by suitably gating and backgating the pullup MOSFET. In another embodiment, two MOSFETs are used in the pullup circuit. Both are backgated by a backgate voltage generator, while one is gated by a gate voltage generator that receives its drive voltage from the bus while the other is controlled by an enable circuit. The pulldown circuit path includes an N-channel MOSFET which is controlled by the enable circuit. Current leakage through the pullup circuit is minimized when overvoltage occurs on the bus by suitably gating and backgating the pullup MOSFETs. The tristate driver is a general output driver having other applications as well, including application as a voltage driver.

32 Claims, 4 Drawing Sheets

TRISTATE DRIVER FOR INTERFACING TO A BUS SUBJECT TO OVERVOLTAGE CONDITIONS

This application is a continuation of application Ser. No. 08/015,726, field Feb. 10, 1993 abandoned.

BACKGROUND OF THE INVENTION

1. Field of the Invention

The present invention relates to voltage drivers, and more particularly to a MOSFET driver for interfacing a digital circuit to a bus subject to overvoltage conditions.

2. Description of Related Art

Input/output ("I/O") circuits are commonly used to interface digital circuits to a common bus. FIG. 1 shows a typical I/O circuit 100 that includes a pullup/pulldown circuit 110, an input buffer 176 comprising inverters 172 and 174 for furnishing signals from the bus to a digital circuit, an enable circuit 130 responsive to an enable signal on terminal 104 for placing the pullup/pulldown circuit 110 in a high impedance state or for controlling the operation of pullup/pulldown circuit 110 in accordance with the logic state of a signal on the data input terminal 105, and I/O terminal 170 which connects to the bus.

Pullup/pulldown circuit 110 includes P-channel MOSFET 111 having a gate connected to the enable circuit 130, a source connected to $V_{dd}$ voltage Supply rail 120, a drain connected to I/O terminal 170, and a body connected to $V_{dd}$ rail 120. Pullup/pulldown circuit 110 also includes N-channel MOSFET 112 having a gate connected to the enable circuit 130, a drain connected to the I/O terminal 170, a source connected to ground rail 140, and a body connected to ground rail 140.

When the enable signal EN is HIGH, I/O circuit 100 is in output mode. NAND gate 103 and NOR gate 102 apply the inverse of the logic state of signal DATA_IN to the gate of MOSFET 111 and to the gate of MOSFET 112. When the input signal DATA_IN is HIGH, MOSFET 111 is ON to maintain a current path between $V_{dd}$ rail 120 and I/O terminal 170 to drive the data bus HIGH, while MOSFET 112 is OFF to isolate the I/O terminal 170 from the ground rail 140. Alternatively, when DATA_IN is LOW, MOSFET 111 is OFF to isolate $V_{dd}$ rail 120 from I/O terminal 170, while MOSFET 112 is ON to maintain a current path between the I/O terminal 170 and the ground rail 140 to pull the data bus LOW.

When EN is LOW, the I/O circuit 100 is in a high impedance mode. NAND gate 103 applies a HIGH voltage to the gate of MOSFET 111, and NOR gate 102 applies a LOW voltage to the gate of MOSFET 112. MOSFET 111 is OFF to isolate the $V_{dd}$ rail 120 from I/O terminal 170, and MOSFET 112 is OFF to isolate I/O terminal 170 from ground rail 140. The pullup/pulldown circuit 110 is therefore in a high impedance state so that logic signals present on I/O terminal 170 are furnished to terminal 178, unaffected by the DATA_IN signal on terminal 105.

With the development of 3.3 volt logic circuits, interfacing 3.3 volt and 5.0 volt circuits on the same bus became desirable. Unfortunately, interfacing 3.3 volt digital circuits using the conventional I/O circuit shown in FIG. 1 to a bus driven by a 5.0 volt digital circuit results in current leakage from the 5.0 volt data bus through the channel region and the parasitic drain-body and source-body junction diodes of MOSFET 111 into $V_{dd}$ rail 120. While the amount of the leakage current is process and device dependant, the leakage is undesirable for a number of reasons. Leakage increases power consumption, leads to the generation of excessive heat which reduces integrated circuit reliability, and if excessive, significantly loads the 5.0 volt bus which reduces the noise margin.

SUMMARY OF THE INVENTION

In accordance with the present invention, the output of a low voltage circuit is interfaced to a conductor having low, high, or mixed low and high voltage signals thereon without introducing current leakage. Reduced power consumption and heat generation, as well as improved noise margins, are realized.

These and other advantages are realized in the present invention, which in one embodiment is an output driver which comprises a pullup circuit for providing a field effect controlled current path. A backgate voltage circuit is provided for furnishing an output substantially equal to the voltage on the output terminal when the voltage on an output terminal exceeds a source voltage, and otherwise for furnishing the source voltage at its output. A gate voltage circuit is provided for gating the current path in conjunction with the backgate voltage so that the current path is established in a first control state, and the current path and leakage therethrough are suppressed in a second control state. Further embodiments include one transistor and two transistor current paths.

DETAILED DESCRIPTION OF THE PREFERRED EMBODIMENTS

Figure 1:
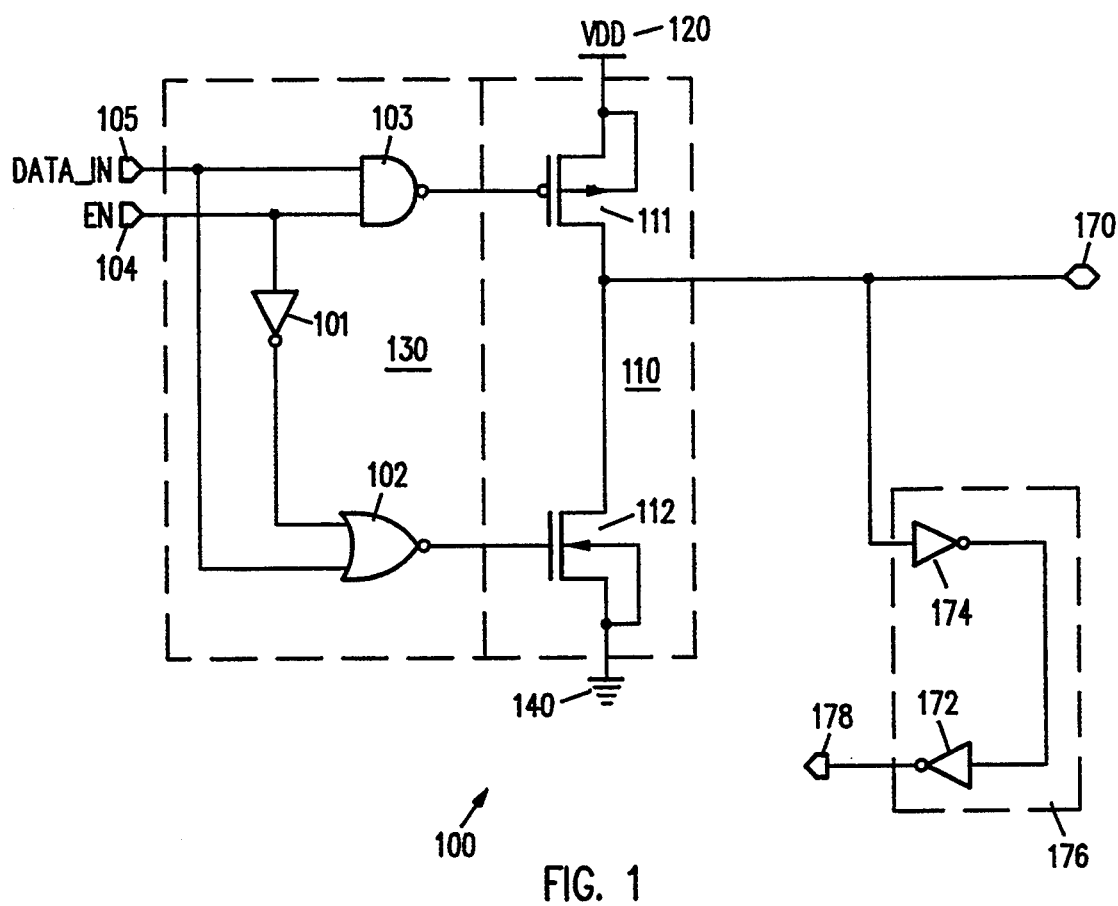
FIG. 1 is a transistor level schematic diagram of a conventional I/O circuit of the prior art.
Figure 2:
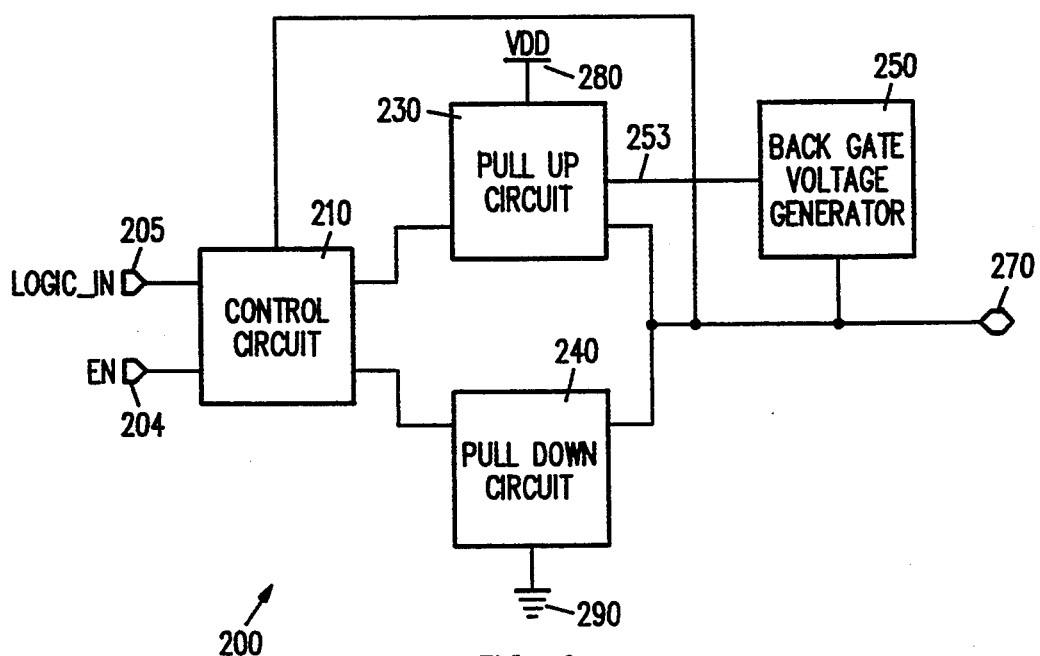
FIG. 2 is a block level schematic diagram of an I/O circuit in accordance with the present invention.

FIG. 2 shows an I/O circuit 200 which interfaces the output of a 3.3 volt digital circuit (not shown) connected to the digital logic signal LOGIC_IN input terminal 205 to a mixed 3.3/5.0 volt digital logic bus (not shown). Illustratively, the digital logic bus may be a data bus or an address bus. I/O circuit 200 includes an enable signal EN terminal 204 and a logic signal LOGIC_IN input terminal 205, control circuit 210, pullup circuit 230, pulldown circuit 240, backgate voltage generator 250, and I/O terminal 270.

When enabled by signal EN at terminal 204, the I/O circuit 200 is in output mode and provides a current path between the output terminal 270 and the 3.3-volt $V_{dd}$ rail 280 for one logic state of the input signal LOGIC_IN, and provides a current path between the output terminal 270 and a reference rail 290, typically a ground rail, for the other logic state of LOGIC_IN. When disabled by signal EN, the I/O circuit 200 is in high impedance mode and isolates the output terminal 270 from the $V_{dd}$ rail 280 and ground rail 290, thereby presenting a high impedance to any digital signals, including both 3.3 volt and 5.0 volt digital signals, present on the bus. The value of the impedance is process and device dependent, but illustratively is on the order of 1 Megaohm or greater.

Illustratively, control circuit 210 functions as follows in output mode. In response to LOGIC_IN equals logical ONE, for example, the control circuit 210 generates signals to activate pullup circuit 230 and to deactivate pulldown circuit 240. While activated, pullup circuit 230 provides a current path between the $V_{dd}$ rail 280 and the I/O terminal 270 to drive the bus HIGH. While deactivated, pulldown circuit 240 isolates the I/O terminal 270 from the ground rail 290. In response to LOGIC_IN equal logical ZERO, for example, the control circuit 210 generates signals to deactivate pullup circuit 230 and to activate pulldown circuit 240. While activated, pulldown circuit 240 provides a current path between the I/O terminal 270 and the ground rail 290 to pull the bus LOW. While deactivated, pullup circuit 230 isolates the I/O terminal 270 from the $V_{dd}$ rail 280.

Control circuit 210 functions in high impedance mode to generate signals to deactivate both pullup circuit 230 and pulldown circuit 240, thereby isolating the I/O terminal 270 from both the $V_{dd}$ rail 280 and the ground rail 290.

The pullup circuit 230 is an output driver which includes a field effect controlled current path having one or more MOSFETs. These MOSFETs are dynamically backgated to suppress leakage current through pullup circuit 230. The backgate voltage generator 250 furnishes the dynamically varying backgate voltage to one or more MOSFETs in the pullup circuit 230. The backgate voltage generator 250 compares the voltage on the I/O terminal 270 to $V_{dd}$, and provides the greater voltage on a protect line 253. The voltage on the protect line 253 is applied to backgate the MOSFET or MOSFETs of pullup circuit 230 to prevent current leakage from I/O terminal 270 to the $V_{dd}$ rail 280 through pullup circuit 230.

The pulldown circuit 240 includes a field effect controlled current path having one or more MOSFETs.

Advantageously, the field effect controlled current paths in the pullup circuit 230 and the pulldown circuit 240 are capable of driving CMOS logic devices as well as devices of other logic families. Since the inputs to CMOS devices are insulated gates, CMOS logic devices and the bus to which they are connected present a primarily capacitive load on the order of about 10 to 200 picofarads. When I/O circuit 200 drives this load, little driving current need flow through I/O terminal 270 except during switching. Thus, although influenced by fanout, the power dissipated by pullup and pulldown circuits 230 and 240 is generally low, and circuits 230 and 240 may be implemented with low output sourcing and sinking current capabilities, respectively. When driving loads of other logic families, for example TTL, pullup circuit 230 supplies a significant amount of current when the data signal is HIGH, while pulldown circuit 240 sinks a significant amount of current when the data signal is LOW. Pullup and pulldown circuits 230 and 240 should, therefore, be implemented with sufficient output sourcing or sinking current capabilities.

Figure 3:
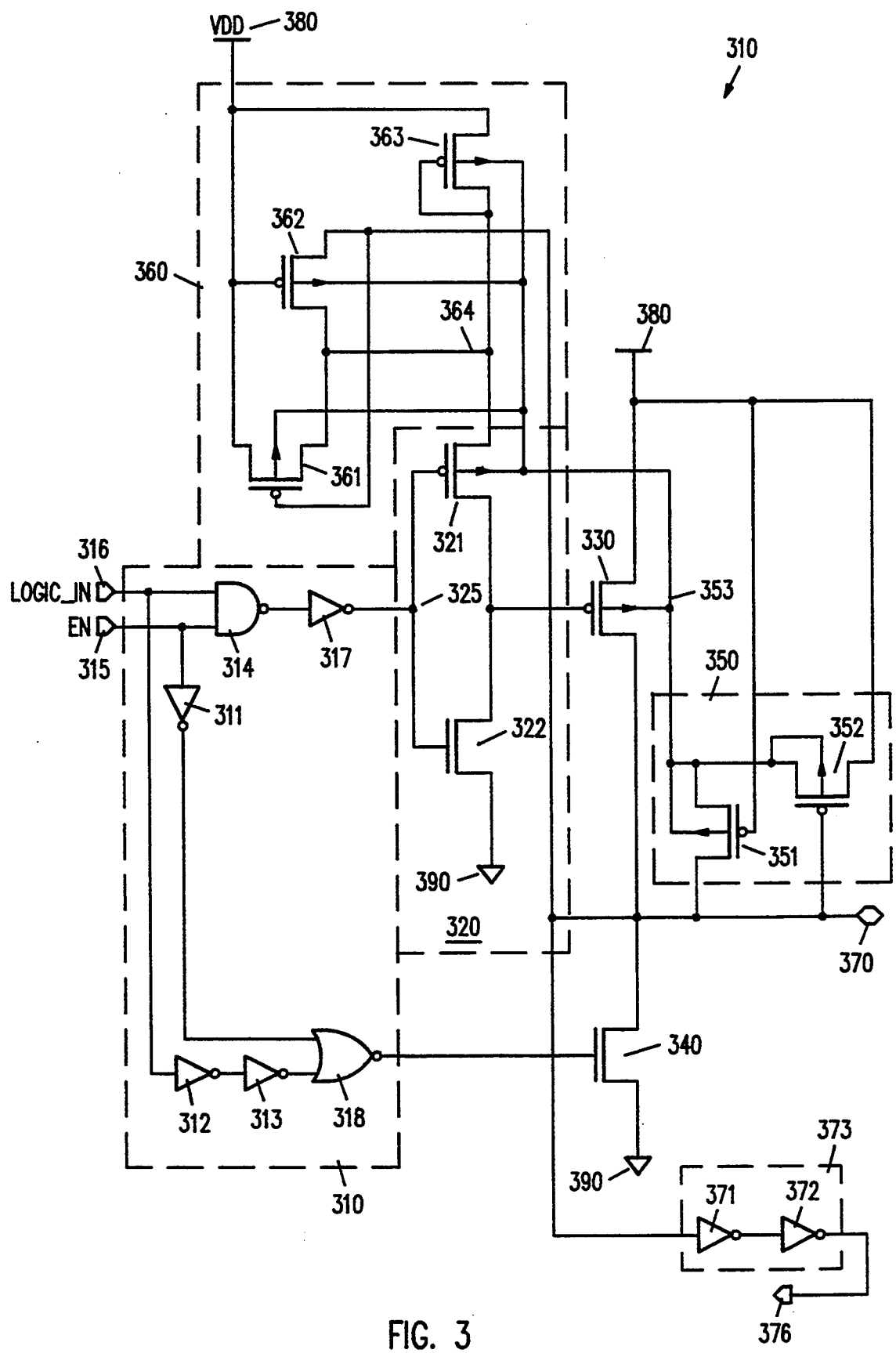
FIG. 3 is a transistor level schematic diagram of an embodiment of the I/O circuit shown in FIG. 2.

An embodiment of the I/O circuit 200 is shown in FIG. 3. Enable circuit 310, gate voltage generator 320, and comparator 360 collectively implement control circuit 210. A single P-channel enhancement-type MOSFET transistor 330 implements the pullup circuit 230. N-channel enhancement-type MOSFET transistor 340 implements pulldown circuit 240. Comparator 350 implements backgate voltage generator 250. Enable input terminal 315 corresponds to enable input terminal 204, data input terminal 316 corresponds to logic input terminal 205, and I/O terminal 370 corresponds to I/O terminal 270. An input buffer 373 includes inverters 371 and 372. Transistors 321, 330, 351, 352, 361, 362, and 363 are P-channel enhancement-mode MOSFETs (metal-oxide field-effect transistor), while transistors 322 and 340 are N-channel enhancement-mode MOSFETs.

Enable circuit 310 incorporates 3.3 volt CMOS circuitry and includes inverters 311, 312, 313 and 317, NAND gate 314, and NOR gate 318. When enable signal EN is HIGH at terminal 315, circuit 300 is in output mode. NAND gate 314, which receives signals EN and LOGIC_IN, in effect furnishes through inverter 317 a signal having a state equal to LOGIC_IN to gate voltage generator 320 at node 325. NOR gate 318, which receives the complement of EN from inverter 311 and LOGIC_IN from inverters 312 and 313, in effect applies the complement of LOGIC_IN to the gate of transistor 340. When signal EN is LOW, circuit 300 is in high impedance mode. NAND gate 314, which receives signals EN and LOGIC_IN, in effect blocks signal LOGIC_IN and applies a logic ZERO to gate voltage generator 320 at node 325 through inverter 317. NOR gate 318, which receives the complement of EN from inverter 311 and LOGIC_IN from inverters 312 and 313, in effect blocks signal LOGIC_IN and applies a logic ZERO to the gate of transistor 340.

Comparator 360 includes P-channel transistors 361, 362, and 363. Comparator 360 compares $V_{dd}$ from rail 380 with the voltage on I/O terminal 370 and selects the larger voltage for application to the gate voltage generator 320. Transistor 361 has a gate connected to I/O terminal 370, a source connected to $V_{dd}$ rail 380, and a drain connected to node 364. Transistor 362 has a gate connected to $V_{dd}$ rail 380, a source connected to I/O terminal 370, and a drain connected to node 364. Diode-connected transistor 363 has a source connected to $V_{dd}$ rail 380, and a gate and drain connected to each other and to node 364.

If $V_{bus}=5$ volts, the voltage on I/O terminal 370 is substantially more positive than $V_{dd}$. Transistor 361 is OFF and transistor 362 is ON. Transistor 362 applies the voltage on I/O terminal 370 to node 364 so that approximately $V_{bus}$ is maintained on node 364. If $V_{bus}=0$ volts, the voltage on I/O terminal 370 is substantially more negative than $V_{dd}$ rail 380. Transistor 362 is OFF and transistor 361 is ON. Transistor 361 applies $V_{dd}$ rail 380 to node 364 so that approximately $V_{dd}$ is maintained on node 364. If the voltage on I/O terminal 370 is substantially equal to $V_{dd}$, transistors 361 and 362 are OFF. In summary, comparator 360 ensures that approximately $V_{dd}$ or $V_{bus}$, whichever is larger, is maintained at node 364.

The diode connected transistor 363 is effective during a high to low transition on I/O terminal 370 when circuit 310 is enabled. When I/O terminal 370 is being driven by 3.3 volts from the $V_{dd}$ rail 380, the gate of transistor 330 is zero volts. To turn transistor 330 off, its gate should be raised to 3.3 volts. But because charge is shared between node 364 and the gate of transistor 330 when transistor 321 turns on, transistor 363 turns on and maintains node 364 at one diode drop below $V_{dd}$. Node 364 remains at one diode drop below $V_{dd}$ until I/O terminal 370 reaches one diode drop below $V_{dd}$, at which time transistor 361 turns on and pulls node 364 up to $V_{dd}$. Note that if desired, transistor 363 could be omitted by appropriately sizing transistors 361 and 362 larger.

Gate voltage generator 320 includes P-channel transistor 321 and N-channel transistor 322. The output of gate voltage generator 320 is the commonly connected drains of transistors 321 and 322. Node 325, the input of gate voltage generator 320, is the commonly connected gates of transistors 321 and 322. Transistor 321 has a source connected to node 364 of comparator 360. Transistor 322 has a source connected to ground rail 390.

Node 325 is LOW when circuit 300 is in high impedance mode (EN LOW). In response, transistor 322 is OFF and transistor 321 is ON, so that the voltage on node 364 is applied to the gate of transistor 330 to turn it OFF. Thus, when $V_{bus}=5$ volts, approximately 5 volts is applied to the gate of transistor 330, both turning transistor 330 OFF and ensuring that the bus is well isolated from $V_{dd}$ rail 380. When $V_{bus}=3.3$ volts or 0 volts, transistor 321 applies the voltage on node 364, which is $V_{dd}$, to the gate of transistor 330, both turning transistor 330 OFF and ensuring that the bus is well isolated from $V_{dd}$ rail 380.

Node 325 receives from enable circuit 310 a signal corresponding to the logic state of LOGIC__IN when circuit 300 is in output mode (EN HIGH). When LOGIC__IN is HIGH, node 325 is HIGH. In response, transistor 322 is ON and transistor 321 is OFF, thereby applying ground potential from rail 390 to the gate of transistor 330 to turn it ON. Alternatively, when LOGIC__IN is LOW, node 325 is LOW. In response, transistor 321 is ON and transistor 322 is OFF, thereby applying the voltage on node 364 to the gate of transistor 330 to turn it OFF.

Transistor 330 has a gate connected to the output of gate voltage generator 320, a source connected to $V_{dd}$ rail 380, and a drain connected to I/O terminal 370. When circuit 300 is in output mode, transistor 330 has either 0 or 3.3 volts applied to its gate and is backgated by 3.3 volts. Transistor 330 responds to 0 volts at its gate by turning ON to establish a current path between $V_{dd}$ rail 380 and I/O terminal 370 to drive the bus HIGH. Transistor 330 responds to 3.3 volts on its gate by turning completely OFF to isolate I/O terminal 370 from the $V_{dd}$ rail 380. When circuit 300 is in high impedance mode, transistor 330 has the voltage on node 364 applied to its gate and a voltage substantially equal to the voltage on node 364 applied to its backgate by the backgate voltage generator 350. Hence, transistor 330 turns completely OFF to isolate I/O terminal 370 from the $V_{dd}$ rail 380, and is appropriately biased to minimize leakage from I/O terminal 370 to $V_{dd}$ rail 380 via the parasitic diode or channel of transistor 330.

Transistor 340 has a gate connected to NOR gate 318, a source connected to the ground rail 390, a drain connected to the I/O terminal 370, and a backgate at ground potential. When circuit 300 is in output mode, NOR gate 318 applies a signal corresponding to the complement of LOGIC__IN to the gate of transistor 340, which is accordingly either ON or OFF. When LOGIC__IN is LOW, transistor 340 is ON to establish a current path from I/O terminal 370 to ground rail 390 for pulling down the I/O terminal 370. When LOGIC__IN is HIGH, transistor 340 is OFF to isolate I/O terminal 370 from ground rail 390. When circuit 300 is in high impedance mode, NOR gate 318 applies a LOW logic state to the gate of transistor 340, ensuring that transistor 340 remains OFF to provide isolation between I/O terminal 370 and ground 390.

Comparator 350 includes transistors 351 and 352 and protect line 353. Comparator 350 compares $V_{dd}$ rail 380 to any voltage on I/O terminal 370, and furnishes the larger voltage to protect line 353. Protect line 353 applies the selected larger voltage to the N-conductivity type bodies, also referred to as backgates, of P-channel MOSFETs 321, 330, 351, 352, 361, 362, and 363. Transistor 351 has a gate connected to $V_{dd}$ rail 380, a source connected to I/O terminal 370, and a drain connected to protect line 353. Transistor 352 has a gate connected to I/O terminal 370, a source connected to $V_{dd}$ rail 380, and a drain connected to protect line 353.

Transistor 351 is connected in a manner for establishing the appropriate backgate voltage on protect line 353. Generally, the voltage on the protect line 353 is either voltage $V_{dd}$ or greater. The voltage on the I/O terminal 370 can be less than, equal to, or greater than $V_{dd}$. When the voltage on I/O terminal 370 is less than $V_{dd}$ and the voltage on the protect line 353 is $V_{dd}$, transistor 351 is OFF to maintain the voltage on protect line 353 at $V_{dd}$. If the voltage on the protect line is greater that $V_{dd}$, both transistors 351 and 352 turn ON to discharge the protect line 353 down to $V_{dd}$. When the voltage on the I/O terminal 370 and on the protect line 353 are approximately equal to $V_{dd}$, transistors 351 and 352 are OFF, and approximately $V_{dd}$ is maintained on protect line 353. When the voltage on I/O terminal 370 is greater than $V_{dd}$, as when the bus is driven by 5.0 volt logic, transistor 351 is ON and transistor 352 is OFF. As a result, the protect line 353 is raised to the potential of the voltage on the I/O terminal 370.

Transistor 352 is particularly effective in two circumstances. During power up with the voltage on the I/O terminal 370 at zero volts, transistor 352 allows the protect line 353 to follow the voltage on $V_{dd}$ rail 380. When the voltage on the I/O terminal 370 is in a falling transition from 5 volts, transistor 352 maintains the protect line 353 at the potential of the $V_{dd}$ rail 380, despite charge pump action.

Comparator 350 backgates the N-type bodies of P-channel MOSFETs 321, 330, 351, 352, 361, 362, and 363 via protect line 353 using the selected larger voltage of $V_{dd}$ 380 or I/O terminal 370. Backgating with the protect line 353 insures that the inherent parasitic source-body and drain-body junction diodes of MOSFETs 321, 330, 351, 352, 361, 362, and 363 are reverse-biased, thereby preventing source-body and drain-body leakage current when the bus is active HIGH. Moreover, in high impedance mode of the circuit 300, the isolation of the $V_{dd}$ rail 380 from an active HIGH bus results from backgating appropriate ones of the P-channel MOSFET transistors, including transistors such as transistor 330 in the pullup current path, with the larger of $V_{bus}$ or $V_{dd}$.

The backgating technique used in circuit 300 is further advantageous when the circuit 300 is powered-down. When $V_{dd}$ rail 380 is powered down and an external driver drives the bus HIGH, comparator 350 continues to backgate P-channel MOSFETs 321, 330, 351, 352, 361, 362, and 363 with $V_{bus}$ applied through the I/O terminal 370. Comparator 360 applies $V_{bus}$ through transistor 362 to gate voltage generator 320 which, in turn, applies $V_{bus}$ through transistor 321 to the gate of transistor 330. As transistor 330 is gated and backgated by $V_{bus}$, it is OFF. Therefore, circuit 300 substantially eliminates current leakage from the bus to the powered-down $V_{dd}$ rail 380 via I/O terminal 370. While the actual current leakage is process and device dependent, illustratively, when $V_{bus}=5.0$ volt, the leakage current in the powered-up or powered-down mode is approximately 0.1 nanoamperes for an I/O circuit designed for four milliampere DC operation.

Figure 4:
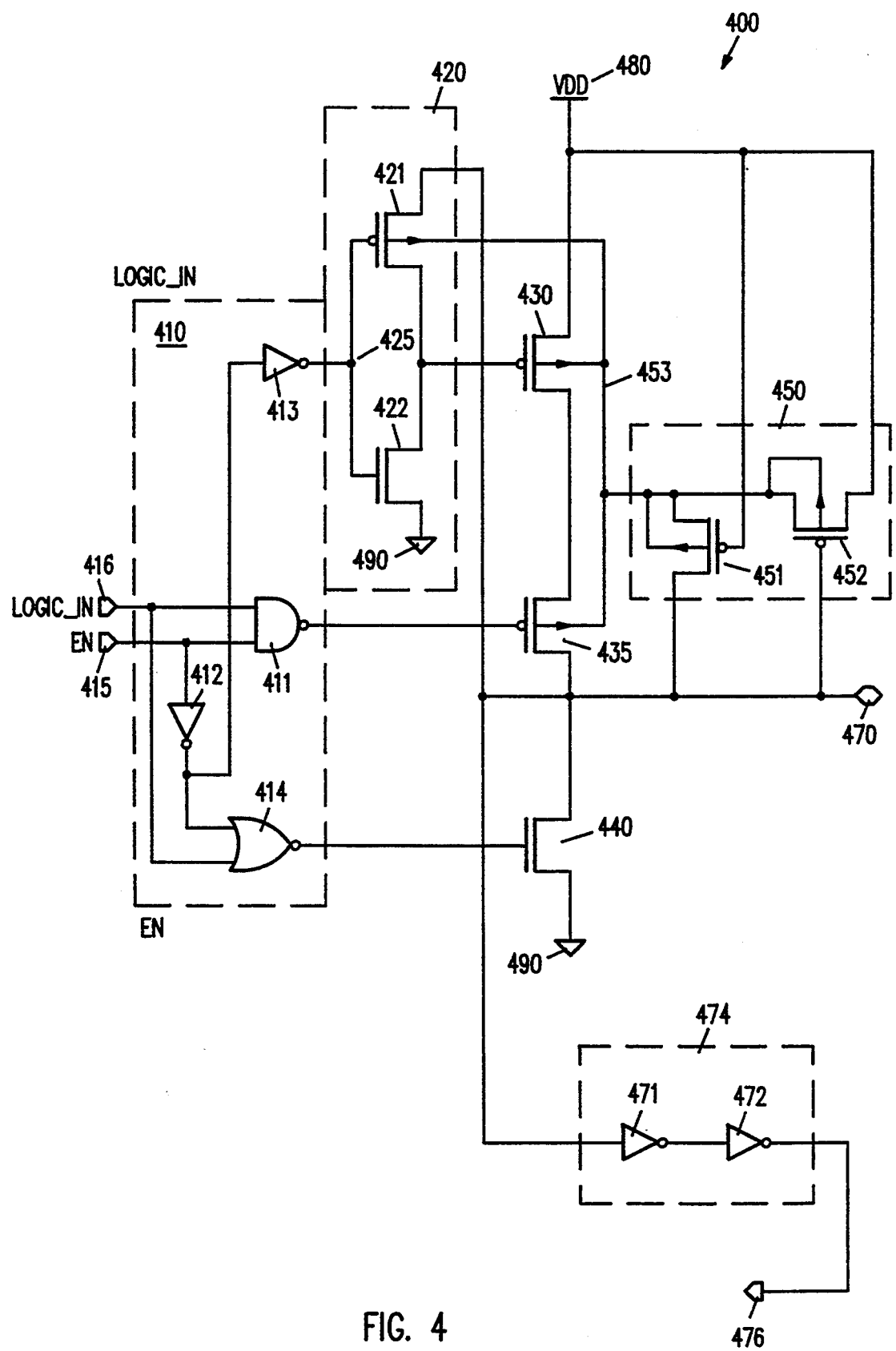
FIG. 4 is a transistor level schematic diagram of another embodiment of the I/O circuit shown in FIG. 2.

Another embodiment of I/O circuit 200 is shown in FIG. 4. Enable circuit 410 and gate voltage generator 420 implement control circuit 210. P-channel enhancement-mode MOSFET transistors 430 and 435 implement pullup circuit 230. N-channel enhancement-mode MOSFET transistor 440 implements pulldown circuit 240. Comparator 450 implements backgate voltage generator 250. Enable signal input terminal 415 corresponds to enable input terminal 204, and data input terminal 416 corresponds to logic input terminal 205. I/O terminal 470 corresponds to I/O terminal 270. Input buffer 474 includes inverters 471 and 472. Transistors 421, 430, 435, 451, and 452 are P-channel enhancement-mode MOSFETs, and transistors 422 and 440 are N-channel enhancement-mode MOSFETs.

Enable circuit 410 incorporates 3.3 volt CMOS circuitry and includes inverters 412 and 413, NAND gate 411, and NOR gate 414. When enable signal EN is HIGH at terminal 415, circuit 400 is in output mode. NAND gate 411, which receives signals EN and LOGIC_IN, in effect furnishes a signal having a state equal to the complement of LOGIC_IN to the gate of transistor 435, which controls the ON/OFF state of transistor 435. NOR gate 414, which receives the complement of EN from inverter 412 and LOGIC_IN from terminal 416, in effect applies a signal equal to the complement of LOGIC_IN to the gate of transistor 440, which controls the ON/OFF state of transistor 440. When enable signal EN is LOW, circuit 400 is in high impedance mode. NAND gate 411, which receives signals EN and LOGIC_IN, in effect blocks signal LOGIC_IN and applies $V_{dd}$ to the gate of transistor 435, which turns transistor 435 OFF unless an overvoltage condition occurs on the bus. NOR gate 414, which receives the complement of EN from inverter 412 and LOGIC_IN from terminal 416, in effect blocks signal LOGIC_IN and applies a ground potential to the gate of transistor 440, which turns transistor 440 OFF.

Gate voltage generator 420 includes P-channel transistor 421 and N-channel transistor 422. The output of gate voltage generator 420 is the commonly connected drains of transistors 421 and 422. Node 425, the input of gate voltage generator 420, is the commonly connected gates of transistors 421 and 422. Transistor 421 has a source connected to the I/O terminal 470. Transistor 422 has a source connected to ground rail 490. Gate voltage generator 420 controls the gate voltage of pullup transistor 430, which has a gate connected to the output of gate voltage generator 420, a source connected to $V_{dd}$ rail 480, and a drain connected to the source of transistor 435, and is backgated by the output of the backgate voltage generator 450 on protect line 453.

Node 425 is LOW when circuit 400 is in high impedance mode (EN LOW). Transistor 422 is OFF and transistor 421 is ON or OFF depending on $V_{bus}$. When $V_{bus}$ is overvoltage HIGH, illustratively 5 volts, transistor 421 is ON and applies approximately 5 volts to the gate of transistor 430, which is also backgated by 5 volts. Transistor 430 turns OFF, and prevents any current from flowing in the current path between the $V_{dd}$ rail 480 and the I/O terminal 470. Note that although transistor 435 is gated by 3.3 volts and backgated by 5 volts, current does not flow through transistor 435 because transistor 430 is OFF. When $V_{bus}$ is HIGH, illustratively 3.3 volts, transistor 421 is ON and applies approximately 3.3 volts to the gate of transistor 430, which also is backgated by 3.3 volts. Transistor 430 turns OFF, and prevents any current from flowing in the current path between the $V_{dd}$ rail 480 and the I/O terminal 470. When $V_{bus}$ is LOW, illustratively 0 volts, transistor 421 turns ON in the direction of I/O terminal 470 until the $V_{gate}$ of transistor 430 is less than or equal to $V_T$, at which point transistor 421 is cutoff. As transistor 421 discharges the gate of transistor 430, transistor 430 turns ON. Nonetheless, current does not flow between the $V_{dd}$ rail 480 and the I/O terminal 470, since transistor 435 is OFF.

Node 425 is HIGH when I/O circuit 400 is in output mode (EN HIGH). In response, transistor 422 is ON and transistor 421 is OFF, so that the gate of transistor 430 is grounded. Because transistor 430 is backgated by 3.3 volts, it is always ON, and conduction in the current path between $V_{dd}$ rail 480 and I/O terminal 470 depends on the state of conduction of transistor 435.

Transistor 435 has a gate connected to NAND gate 411, a source connected to the drain of transistor 430, and a drain connected to I/O terminal 470. When I/O circuit 400 is in output mode, transistor 435 is either ON or OFF in accordance with the logic state of LOGIC_IN. When LOGIC_IN is logical ONE, transistor 435 is ON. When LOGIC_IN is logical ZERO, transistor 435 is OFF. When circuit 400 is in high impedance mode (EN LOW), $V_{dd}$ is applied to the gate of transistor 435. When the voltage on I/O terminal 470 is less than $V_{dd}$, transistor 435 is OFF. However, when the voltage on I/O terminal 470 is greater than $V_{dd}$, illustratively 5 volts, transistor 435 is ON. However, in this event transistor 430 blocks the current path between transistor 435 and the $V_{dd}$ rail 480.

Transistor 440 has a gate connected to NOR gate 414, a source connected to the ground rail 490, a drain connected to the I/O terminal 470, and a grounded backgate. When I/O circuit 400 is in output mode, NOR gate 414 applies a signal corresponding to the inverse of LOGIC_IN to the gate of transistor 440. Transistor 440 is either ON or OFF in accordance with the state of LOGIC_IN. When LOGIC_IN is logical ZERO, transistor 440 is ON. When LOGIC_IN is logical ONE, transistor 435 is OFF. When circuit 400 is in high impedance mode, NOR gate 414 applies ground potential to the gate of transistor 440 to turn it OFF, thereby isolating I/O terminal 470 and ground rail 490.

Comparator 450 is identical to comparator 350 of FIG. 3, and includes transistors 451 and 452 and protect line 453, which function identically to transistors 351 and 352 and protect line 353, respectively. Comparator 450 compares $V_{dd}$ on rail 480 with the voltage on I/O terminal 470 and furnishes the larger voltage to protect line 453. Protect line 453 applies the selected larger voltage to the N-type bodies, also referred to as backgates, of P-channel MOSFET transistors 421, 430, 435, 451, and 452.

When circuit 400 is in high impedance mode, the isolation of $V_{dd}$ 480 from an active HIGH bus results from backgating P-channel MOSFET transistors 421, 430, 435, 451, and 452 and gating transistor 430 with the larger of $V_{dd}$ or $V_{bus}$. Additionally, although the foregoing illustrative embodiment describes the isolation of $V_{dd}$ 480 during its powered-up mode, isolation of $V_{dd}$ 480 during its powered-down mode also occurs. When $V_{dd}$ 480 is powered down and an external driver drives the bus HIGH, comparator 450 continues to backgate P-channel MOSFETs 421, 430, 435, 451, and 452 with $V_{bus}$, applied through the I/O terminal 470. Further, gate voltage generator 420 applies $V_{bus}$ to the gate of transistor 430. As transistor 430 is gated and backgated by $V_{bus}$, it is OFF. Therefore, circuit 400 substantially eliminates current leakage from the bus to the powered-down $V_{dd}$ rail 480. While actual current leakage is process and device dependent, illustratively, when $V_{bus}$=5.0 volt, the leakage current in the powered-up or powered-down mode is approximately 0.1 nanoamperes for an I/O circuit designed for four milliampere DC operation.

Figure 5:
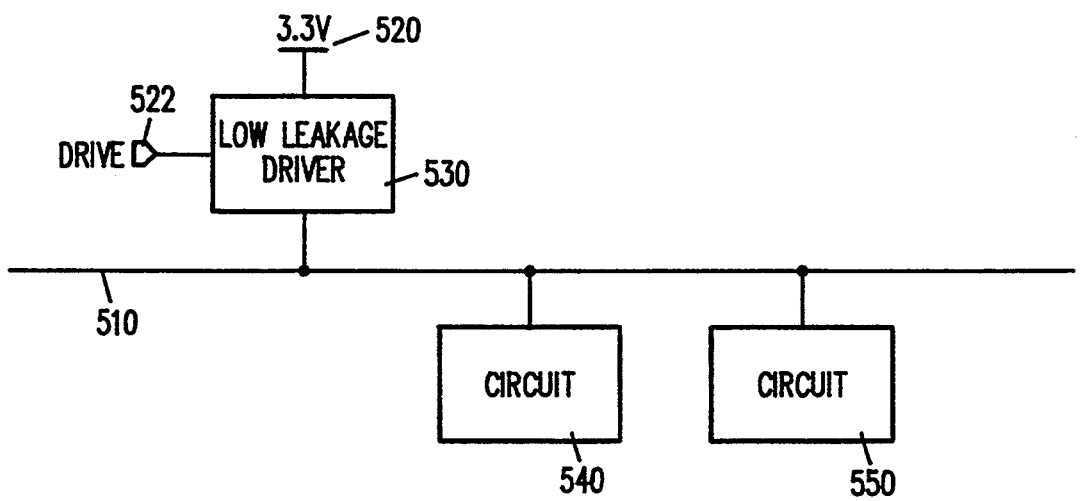
FIG. 5 is a block level schematic diagram of an application for a low leakage driver in accordance with the present invention.

Although the various embodiments of pullup circuit 230 and associated gating and backgating circuits described in the contexts of FIGS. 3 and 4 are particularly suitable for used in conjunction with digital buses, they are more broadly useful for driving any conductor or bus with a particular supply voltage, and are particularly useful for driving a conductor or bus subject to overvoltage from other devices and circuits with a particular supply voltage. The conductor or line 510 of FIG. 5, for example, is connected to respective moderate to high impedance nodes within illustrative circuits 540 and 550. A low leakage driver 530 drives 3.3 volts from supply rail 520 onto line 510 when signal DRIVE is asserted on control input 522, and otherwise isolates the line 510 from supply rail 520.

The low leakage driver 530 includes a current path, at least part of which is the channel of at least one field effect transistor, and may be implemented in a subset of the circuits of either FIGS. 3 or 4. In one embodiment, the current path of the low leakage driver 530 is implemented by P-channel MOSFET 330 of FIG. 3, with the backgate voltage being furnished by the circuit comprising transistors 351 and 352 and protect line 353, and the gate voltage being furnished by the circuit comprising transistors 321, 322, 361, 362, and 363, and node 364. In another embodiment, the current path of the low leakage driver 530 is implemented by P-channel MOSFETs 430 and 435 of FIG. 4, with the backgate voltage being furnished by the circuit comprising transistors 451 and 452 and protect line 453, and the gate voltage being furnished by the circuit comprising transistors 421 and 422.

Figure 6:
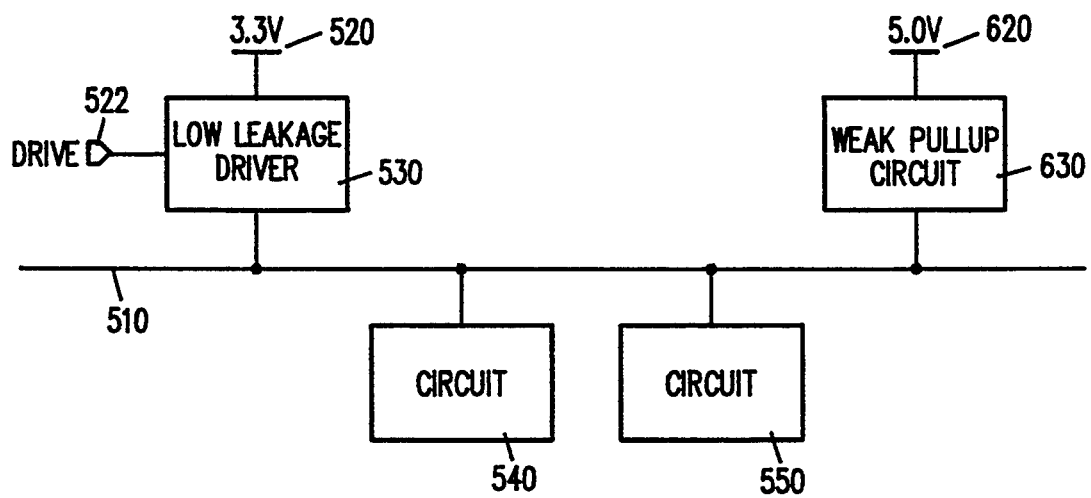
FIG. 6 is a block level schematic diagram of another application of a low leakage driver in accordance with the present invention.

Another application is shown in FIG. 6. The line 510, to which circuits 540 and 550 are connected, is normally pulled up to five volts by supply rail 620 through any suitable weak pullup circuit 630, such as a high value resistor. Despite the presence of five volts on the line 510, no significant leakage occurs through the low leakage driver 530, and five volts is available to the circuits 540 and 550. When signal DRIVE is asserted on the control input 522, the low leakage driver 530 drives a voltage of 3.3 volts from supply rail 520 onto line 510, overpowering the weak pullup circuit 630 and supplying 3.3 volts to the circuits 540 and 550.

Figure 7:
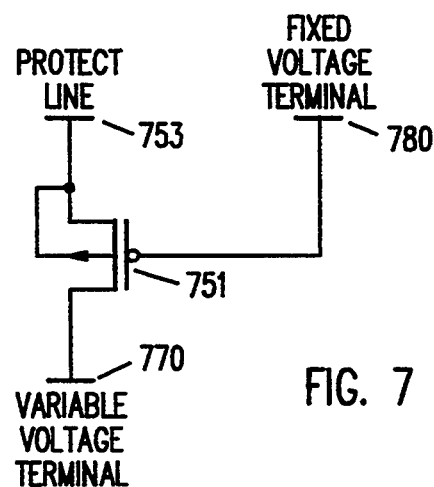
FIG. 7 is a transistor level schematic diagram of a general representation of transistors 351 and 451 shown in FIGS. 3 and 4.

FIG. 7 is a general representation of transistors 351 and 451. P-channel MOSFET 751 has a gate connected to terminal 780 furnishing a fixed voltage, a drain connected to a varying voltage terminal 770, and a source connected to a protect line 753. Transistor 751 is backgated by protect line 753, which provides backgating voltage to a number of P-channel transistors. Note that source and drain are used somewhat arbitrarily, since the roles of these current terminals are reversed depending on the relation of the voltages on lines 753 and 770. Provided the varying voltage on terminal 770 is less than the fixed voltage from terminal 780, transistor 751 maintains the protect line 753 at essentially the fixed voltage on terminal 780. When the varying voltage on terminal 770 exceeds the fixed voltage on terminal 780, transistor 751 provides a voltage on the protect line 753 essentially equal to the voltage on terminal 770.

Although the present invention has been described in terms of the foregoing embodiments, the description has been provided by way of explanation and the invention is not necessarily limited to the embodiments. Illustratively, while the preferred embodiments are implemented in an N-well process, numerous CMOS processes, including twin tub, are suitable as well. Furthermore, while CMOS technology is used to advantage in the embodiments shown, any semiconductor circuitry which exhibits similar or even more advantageous characteristics could be substituted. For example, improved logic structures and innovative integrated circuit technology such as silicon-on-insulator structures, separation by implantation of oxygen (SIMOX), or complementary pass transistor logic (CPL) could be substituted to improve circuit operation speed and reduce power consumption. While the preferred embodiments described above interface a 3.3 volt digital circuit to a mixed 3.3/5.0 volt digital bus, other operating voltage and signal levels are suitable as well. Illustratively, digital circuits operating at 2.5 volts may be interfaced to a mixed 2.5/5.0 volt digital bus by substituting 2.5 volt CMOS circuitry for the 3.3 volt CMOS circuitry. Accordingly, various other embodiments and modifications and improvements not described herein may be within the spirit and scope of the invention, as defined by the following claims.

What is claimed is:

1. An output driver comprising: a source terminal for receiving a source voltage; and output terminal;
    a pullup circuit for providing a field effect controlled current path between the source terminal and the output terminal to apply the source voltage from the source terminal to the output terminal;
    a backgate voltage circuit for backgating the current path with a backgating voltage substantially equal to the voltage on the output terminal when the voltage on the output terminal exceeds the source voltage, and otherwise substantially equal to the voltage on the source terminal; and
    a gate voltage circuit for gating the current path in conjuction with the backgating voltage responsive to a control signal applied to select a gating voltage from among a non-varying reference voltage on one or more reference terminals and a voltage on the output terminal so that the current path is established in a first control state, and the current path and leakage therethrough are suppressed in a second control state.

2. A driver as in claim 1 wherein the pullup circuit comprises a first field effect transistor for controlling the current path, the first field effect transistor having a first current terminal coupled to the source terminal, a second current terminal coupled to the output terminal, a gate for receiving the gating voltage from the gate voltage circuit, and a backgate to which the backgate voltage from the backgate voltage circuit is applied.

3. A driver as in claim 2 wherein:

the first field effect transistor is a P-channel enhancement type transistor having a threshold voltage $V_t$;

when the gate voltage circuit is in the first state, the gating voltage differs from the backgating voltage in excess of $V_T$ so that the current path is established; and when the gate voltage circuit is in the second state, the gating voltage substantially equals the backgating voltage so that the current path and leakage therethrough are suppressed.

4. A driver as in claim 3 wherein:

the supply voltage is 3.3 volts;

when the gate voltage circuit is in the first state, the gating voltage is zero volts and the backgating voltage is 3.3 volts; and when the gate voltage circuit is in the second state, the gating voltage is 3.3 volts; and the backgating voltage is 3.3 volts when a 3.3 volt signal is externally imposed on the output terminal, and the gating voltage is 5 volts and the backgating voltage is 5 volts when a 5 volt signal is externally imposed on the output terminal.

5. An output driver comprising:

a source terminal for receiving a source voltage;

an output terminal;

a pullup circuit for providing a field effect controlled current path between the source terminal and the output terminal to apply the source voltage from the source terminal to the output terminal, wherein the pullup circuit comprises a first field effect transistor for controlling the current path, the first field effect transistor having a first current terminal coupled to the source terminal, a second current terminal coupled to the output terminal, a gate for receiving a gating voltage from the gate voltage circuit, and a backgate to which the backgate voltage from the backgate voltage circuit is applied;

a backgate voltage circuit for backgating the current path with a backgating voltage substantially equal to the voltage on the output terminal when the voltage on the output terminal exceeds the source voltage, and otherwise substantially equal to the voltage on the source terminal; and a gate voltage circuit for gating the current path in conjunction with the backgating voltage so that the current path is established in a first control state, and the current path and leakage therethrough are suppressed in a second control state, wherein the gate voltage circuit comprises: a comparator for comparing the voltage on the source terminal with the voltage on the output terminal and for furnishing an output substantially equal to the voltage on the output terminal when the voltage on the output terminal exceeds the source voltage, and otherwise substantially equal to the voltage on the source terminal; and a gate voltage generator for furnishing as the gating voltage a voltage selected from the output of the comparator and the reference voltage in accordance with the state of the gate voltage circuit.

6. An output driver comprising:

a source terminal for receiving a source voltage;

an output terminal;

a pullup circuit for providing a field effect controlled current path between the source terminal and the output terminal to apply the source voltage from the source terminal to the output terminal, wherein the pullup circuit comprises a first field effect transistor for controlling the current path, the first field effect transistor having a first current terminal coupled to the source terminal, a second current terminal coupled to the output terminal, a gate for receiving a gating voltage from the gate voltage circuit, and a backgate to which the backgate voltage from the backgate voltage circuit is applied, wherein:

the first field effect transistor is a P-channel enhancement type transistor having a threshold voltage $V_T$;

when the gate voltage circuit is in the first state, the gating voltage differs from the backgating voltage in excess of $V_T$ so that the current path is established; and when the gate voltage circuit is in the second state, the gating voltage substantially equals the backgating voltage so that the current path and leakage therethrough are suppressed;

a backgate voltage circuit for backgating the current path with a backgating voltage substantially equal to the voltage on the output terminal when the voltage on the output terminal exceeds the source voltage, and otherwise substantially equal to the voltage on the source terminal; and a gate voltage circuit for gating the current path in conjunction with the backgating voltage so that the current path is established in a first control state, and the current path and leadage therethrough are suppressed in a second control state, wherein the gate voltage circuit comprises:

a second field effect transistor of a P-channel enhancement type having a source coupled to the output terminal, a drain coupled to a first circuit node, a gate coupled to the source terminal, and a backgate to which the backgating voltage is applied;

a third field effect transistor of a P-channel enhancement type having a source coupled to the source terminal, a drain coupled to the first circuit node, a gate coupled to the output terminal, and a backgate to which the backgating voltage is applied;

a fourth field effect transistor of a P-channel enhancement type enhancement type having a source coupled to the first circuit node, a drain coupled to the gate of the first transistor, a gate coupled to a second circuit node, and a backgate to which the backgating voltage is applied; and a fifth field effect transistor of an N-channel enhancement type having a source coupled to a reference voltage terminal, a drain coupled to the gate of the first transistor, and a gate coupled to the second circuit node; wherein the fifth transistor is operative when the gate voltage circuit is in the first state for coupling the gate of the first transistor to the reference potential for furnishing the gating voltage, and wherein the fourth transistor is operative when the gate voltage circuit is in the second state for coupling the gate of the first transistor to the first circuit node for furnishing the gating voltage.

7. An output driver comprising:

a source terminal for receiving a source voltage;
an output terminal;
a pullup circuit for providing a field effect controlled current path between the source terminal and the output terminal to apply the source voltage from the source terminal to the output terminal wherein the pullup circuit comprises first and second field effect transistors for controlling the current path, and wherein:
    the first field effect transistor has a first current terminal coupled to the source terminal, a second current terminal, a gate coupled to the gate voltage circuit for receiving a first gating voltage, and a backgate coupled to the backgate voltage circuit for receiving the backgate voltage; and
    the second field effect transistor has a first current terminal coupled to the second current terminal of the first transistor, a second current terminal coupled to the output terminal, a gate coupled to the gate voltage circuit for receiving a second gating voltage, and a backgate coupled to the backgate voltage circuit for receiving the backgating voltage;
a backgate voltage circuit for backgating the current path with a backgating voltage, the backgate voltage circuit including a comparator for comparing the source voltage to the voltage on the output terminal and for supplying the backgating voltage from the output terminal when the voltage on the output terminal exceeds the source voltage, and otherwise supplying the backgating voltage from the source terminal; and
a gate voltage circuit for gating the current path in conjunction with the backgating voltage so that the current path is established in a first control state, and the current path and leadage therethrough are suppressed in a second control state.

8. An output driver comprising:
a source terminal for receiving a source voltage;
an output terminal;
a pullup circuit for providing a field effect controlled current path between the source terminal and the output terminal to apply the source voltage from the source terminal to the output terminal wherein the pullup circuit comprises first and second field effect transistors for controlling the current path, and wherein:
    the first field effect transistor has a first current terminal coupled to the source terminal, a second current terminal, a gate coupled to the gate voltage circuit for receiving a first gating voltage, and a backgate coupled to the backgate voltage circuit for receiving the backgating voltage; and
    the second field effect transistor has a first current terminal coupled to the second current terminal of the first transistor, a second current terminal coupled to the output terminal, a gate coupled to the gate voltage circuit for receiving a second gating voltage, and a backgate coupled to the backgate voltage circuit for receiving the backgating voltage;
a backgate voltage circuit for backgating the current path with a backgating voltage substantially equal to the voltage on the output terminal when the voltage on the output terminal exceeds the source voltage, and otherwise substantially equal to the voltage on the source terminal; and
a gate voltage circuit for gating the current path in conjunction with the backgating voltage so that the current path is established in a first control state, and the current path and leakage therethrough are suppressed in a second control state, wherein:
    the first field effect transistor is a P-channel enhancement type transistor having a threshold voltage $V_T$;
    the second field effect transistor is a P-channel enhancement type transistor having a threshold voltage $V_T$;
    when the gate voltage circuit is in the first state, the first gating voltage and the backgating voltage are unequal in excess of $V_T$ and the second gating voltage and the backgating voltage are unequal in excess of $V_T$ so that the current path is established; and
    when the gate voltage circuit is in the second state, the first gating voltage and the backgating voltage are substantially equal when the voltage on the output terminal is at least equal to the source voltage, and the second gating voltage and the backgating voltage are substantially equal when the voltage on the output terminal is less than the source voltage.

9. A driver as in claim 8 wherein:
the supply voltage is 3.3 volts;
when the gate voltage circuit is in the first state, the first gating voltage is zero volts, the second gating voltage is zero volts, and the backgating voltage is 3.3 volts; and
when the gate voltage circuit is in the second state, the first gating voltage and the backgating voltage are equal to 3.3 volts when the voltage on the output terminal is 3.3 volts, the first gating voltage and the backgating voltage are equal to 5 volts when the voltage on the output terminal is 5 volts, and the second gating voltage and the backgating voltage are equal to 3.3 volts when the voltage on the output terminal is zero volts.

10. A driver as in claim 7 wherein the gate voltage circuit comprises:
    a gate voltage generator for furnishing as the first gating voltage a voltage selected from the output terminal and from a reference terminal in accordance with the state of the gate voltage circuit; and
    a logic circuit for furnishing as the second gating voltage a voltage selected from the source terminal and from a reference terminal in accordance with the state of the gate voltage circuit.

11. A driver as in claim 8 wherein the gate voltage circuit comprises:
    a third field effect transistor of a P-channel enhancement type enhancement type having a source coupled to the output terminal, a drain coupled to the gate of the first transistor, a gate coupled to a first circuit node, and a backgate to which the backgating voltage is applied; and
    a fourth field effect transistor of an N-channel enhancement type having a source coupled to a reference voltage terminal, a drain coupled to the gate of the first transistor, and a gate coupled to the first circuit node;
wherein the fourth transistor is operative when the gate voltage circuit is in the first state for coupling the gate of the first transistor to the reference potential for furnishing the gating voltage, and wherein the third transistor is operative when the gate voltage circuit is in the second state for coupling the gate of the first transistor to the output terminal for furnishing the gating voltage.

12. A driver as in claim 1 wherein the backgate voltage circuit comprises a first P-channel field effect transistor having a gate, a backgate, and two current terminals, the gate being coupled to the source terminal, one of the current terminals being coupled to the output terminal for receiving the voltage on the output terminal, and the other current terminal and the backgate being commonly connected for maintaining the backgating voltage essentially equal to the voltage on the source terminal when the voltage on the output terminal is less than the voltage on the source terminal, and for furnishing the voltage on the output terminal as the backgating voltage when the voltage on the output terminal exceeds the voltage on the source terminal.

13. A driver as in claim 12 wherein the backgate voltage circuit further comprises a second P-channel field effect transistor having a gate, a backgate, and two current terminals, the gate being coupled to the output terminal, one of the current terminals being coupled to the source terminal for receiving the source voltage, and the other current terminal and the backgate being commonly connected for furnishing the source voltage as the backgating voltage when the voltage on the output terminal is less than the source voltage.

14. A driver as in claim 1 wherein the gate voltage circuit is responsive to an enable signal and a logic signal for establishing the state thereof.

15. An output driver comprising:
a source terminal for receiving a source voltage;
a reference terminal for receiving a reference voltage;
an output terminal;
an enable terminal for receiving an enable signal;
a logic input terminal for receiving a logic signal;
a pullup circuit for providing a first field effect controlled current path between the source terminal and the output terminal to apply the source voltage from the source terminal to the output terminal;
a pulldown circuit for providing a second field effect controlled current path between the reference terminal and the output terminal to apply the reference voltage from the reference terminal to the output terminal;
a backgate voltage circuit for backgating the first current path with a backgating voltage substantially equal to the voltage on the output terminal when the voltage on the output terminal exceeds the source voltage, and otherwise substantially equal to the voltage on the source terminal; and
a control circuit responsive to the enable signal and the logic signal so that:
when the enable signal is in an enable state and the logic signal is in a first state, the first current path is established and the second current path is suppressed;
when the enable signal is in an enable state and the logic signal is in a second state, the first current path and leakage therethrough are suppressed with a voltage selected from the voltage on the output terminal and the voltage on the source terminal to be substantially equal to the greater voltage thereof, and the second current path is established; and
when the enable signal is in a disable state, the first current path and leadage therethrough are suppressed with a voltage selected from the voltage on the output terminal and the voltage on the source terminal to be substantially equal to the greater voltage thereof, and the second current path is suppressed.

16. An output driver comprising:
a source terminal for receiving a source voltage;
a reference terminal for receiving a reference voltage;
an output terminal;
an enable terminal for receiving an enable signal;
a logic input terminal for receiving a logic signal;
a pullup circuit comprising a first field effect transistor of a P-channel enhancement type between the source terminal and the output terminal to apply the source voltage from the source terminal to the output terminal;
a pulldown circuit for providing a second field effect transistor of an N-channel enhancement type between the reference terminal and the output terminal to apply the reference voltage from the reference terminal to the output terminal;
a backgate voltage circuit for backgating the first transistor with a backgating voltage substantially equal to the voltage on the output terminal when the voltage on the output terminal exceeds the source voltage, and otherwise substantially equal to the voltage on the source terminal; and
a control circuit responsive to the enable signal and the logic signal so that:
when the enable signal is in an enable state and the logic signal is in a first state, the first transistor is gated on and the second transistor is gated off;
when the enable signal is in an enable state and the logic signal is in a second state, the first transistor is gated off with a voltage selected from the voltage on the output terminal and the voltage on the source terminal to be substantially equal to the greater voltage thereof so that leakage through the first transistor is suppressed, and the second transistor is gated on; and
when the enable signal is in a disable state, the first transistor is gated off with a voltage selected from the voltage on the output terminal and the voltage on the source terminal to be substantially equal to the greater voltage thereof so that leakage therethrough is suppressed, and the second transistor is gated off.

17. A driver as in claim 16 wherein the backgate voltage circuit comprises:
a third field effect transistor of a P-channel enhancement type having a gate, a backgate, and two current terminals, the gate being coupled to the source terminal, one of the current terminals being coupled to the output terminal for receiving the voltage on the output terminal, and the other current terminal and the backgate being commonly connected for maintaining the backgating voltage essentially equal to the voltage on the source terminal when the voltage on the output terminal is less than the voltage on the source terminal, and for furnishing the voltage on the output terminal as the backgating voltage when the voltage on the output terminal exceeds the voltage on the source terminal; and
a fourth P-channel field effect transistor having a gate, a backgate, and two current terminals, the gate being coupled to the output terminal, one of the current terminals being coupled to the source terminal for receiving the source voltage, and the other current terminal and the backgate being commonly connected for furnishing the source voltage as the backgating voltage when the voltage on the output terminal is less than the source voltage.

18. An output driver comprising:

a source terminal for receiving a source voltage;

a reference terminal for receiving a reference voltage;

an output terminal;

an enable terminal for receiving an enable signal;

a logic input terminal for receiving a logic signal;

a pullup circuit comprising a first field effect transistor of a P-channel enhancement type between the source terminal and the output terminal to apply the source voltage from the source terminal to the output terminal;

a pulldown circuit for providing a second field effect transistor of an N-channel enhancement type between the reference terminal and the output terminal to apply the reference voltage from the reference terminal to the output terminal;

a backgate voltage circuit for backgating the first transistor with a backgating voltage substantially equal to the voltage on the output terminal when the voltage on the output terminal exceeds the source voltage, and otherwise substantially equal to the voltage on the source terminal; and a control circuit responsive to the enable signal and the logic signal so that:

when the enable signal is in an enable state and the logic signal is in a first state, the first transistor is gated on and the second transistor is gated off;

when the enable signal is in an enable state and the logic signal is in a second state, the first transistor is gated off with a voltage substantially equal to the backgating voltage so that leakage through the first transistor is suppressed, and the second transistor is gated on; and when the enable signal is in a disable state, the first transistor is gated off with a voltage substantially equal to the backgating voltage so that leakage therethrough is suppressed, and the second transistor is gated off. Wherein the control circuit comprises:

a third field effect transistor of a P-channel enhancement type having a source coupled to the output terminal, a drain coupled to a first circuit node, a gate coupled to the source terminal, and a backgate to which the backgating voltage is applied;

a fourth field effect transistor of a P-channel enhancement type having a source coupled to the source terminal, a drain coupled to the first circuit node, a gate coupled to the output terminal, and a backgate to which the backgating voltage is applied;

a fifth field effect transistor of a P-channel enhancement type having a source coupled to the first circuit node, a drain coupled to the gate of the first transistor, a gate coupled to a second circuit node, and a backgate to which the backgating voltage is applied; and a sixth field effect transistor of an N-channel enhancement type having a source coupled to a reference voltage terminal, a drain coupled to the gate of the first transistor, and a gate coupled to the second circuit node;

wherein the sixth transistor is operative when the enable signal is in the enable state and the logic signal is in the first state for coupling the gate of the first transistor to the reference potential for furnishing a gating voltage thereto, and wherein the fifth transistor is operative when the enable signal is in the enable state and the logic signal is in the second state, and when the enable signal is in a disable state, for coupling the gate of the first transistor to the first circuit node for furnishing a gating voltage thereto.

19. An output driver comprising:

a source terminal for receiving a source voltage;

a reference terminal for receiving a reference voltage;

an output terminal;

an enable terminal for receiving an enable signal;

a logic input terminal for receiving a logic signal;

a pullup circuit comprising a first field effect transistor of a P-channel enhancement type and a second field effect transistor of a P-channel enhancement type serially connected between the source terminal and the output terminal to apply the source voltage from the source terminal to the output terminal;

a pulldown circuit for providing a third field effect transistor of an N-channel enhancement type between the reference terminal and the output terminal to apply the reference voltage from the reference terminal to the output terminal;

a backgate voltage circuit for backgating the first and second transistors with a backgating voltage substantially equal to the voltage on the output terminal when the voltage on the output terminal exceeds the source voltage, and otherwise substantially equal to the voltage on the source terminal; and a control circuit responsive to the enable signal and the logic signal so that:

when the enable signal is in an enable state and the logic signal is in a first state, the first and second transistors are gated on and the third transistor is gated off;

when the enable signal is in an enable state and the logic signal is in a second state, the second transistor is gated off with a voltage substantially equal to the backgating voltage so that leakage through the second transistor is suppressed, and the first and third transistors are gated on; and when the enable signal is in a disable state, the first transistor is gated off with a voltage substantially equal to the backgating voltage so that leakage therethrough is suppressed, and the third transistor is gated off.

20. A driver as in claim 19 wherein the backgate voltage circuit comprises:

a fourth field effect transistor of a P-channel enhancement type having a gate, a backgate, and two current terminals, the gate being coupled to the source terminal, on of the current terminals being coupled to the output terminal for receiving the voltage on the output terminal, and the other current terminal and the backgate being commonly connected for maintaining the backgating voltage essentially equal to the voltage on the source terminal when the voltage on the output terminal is less than the voltage on the source terminal, and for furnishing the voltage on the output terminal as the backgating voltage when the voltage on the output terminal exceeds the voltage on the source terminal; and a fifth P-channel field effect transistor having a gate, a backgate, and two current terminals, the gate being coupled to the output terminal, one of the current terminals being coupled to the source terminal for receiving the source voltage, and the other current terminal and the backgate being commonly connected for furnishing the source voltage as the backgating voltage when the voltage on the output terminal is less than the source voltage.

21. A driver as in claim 19 wherein the gate voltage circuit comprises:

a fourth field effect transistor of a P-channel enhancement type enhancement type having a source coupled to the output terminal, a drain coupled to the gate of the first transistor, a gate coupled to a first circuit node, and a backgate to which the backgating voltage is applied; and a fifth field effect transistor of an N-channel enhancement type having a source coupled to a reference voltage terminal, a drain coupled to the gate of the first transistor, and a gate coupled to the first circuit node; wherein the fifth transistor is operative when the enable signal is in the enable state and the logic signal is in the first state for coupling the gate of the first transistor to the reference potential for furnishing a gating voltage thereto, and wherein the fourth transistor is operative when the enable signal is in the enable state and the logic signal is in the second state, and when the enable signal is in a disable state, for coupling the gate of the first transistor to the output terminal for furnishing a gating voltage thereto.

22. A driver comprising:
a source terminal;
an output terminal;
a CMOS inverter having a first input terminal, a second input terminal, a third input terminal connected to a reference voltage terminal, an output terminal, and a backgate;
an input logic circuit connected to the first input terminal of the CMOS invertor;
a P-channel field effect transistor, having a backgate, connected to the output terminal of the CMOS inverter and connected between the source terminal and the output terminal;
a P-channel field effect transistor, having a backgate, connected to the output terminal and connected between the source terminal and the second input terminal of the CMOS inverter;
a P-channel field effect transistor, having a backgate, connected to the source terminal and connected between the output terminal and the second input terminal of the CMOS inverter;
a diode-connected P-channel field effect transistor, having a backgate, connected between the source terminal and the second input terminal of the CMOS inverter;
a P-channel field effect transistor, having a backgate, connected to the source terminal and connected between the output terminal and the backgates of the P-channel field effect transistors and the CMOS inverter; and
a P-channel field effect transistor, having a backgate, connected to the output terminal and connected between the source terminal and the backgates of the P-channel field effect transistors and the CMOS inverter.

23. A driver as in claim 22 wherein the input logic circuit comprises a NAND gate receiving a logic signal and an enable signal.

24. A low leakage driver comprising:
a source terminal;
an output terminal;
a CMOS inverter having a first input terminal, a second input terminal connected to the output terminal, a third input terminal connected to a reference voltage terminal, an output terminal, and a backgate;
an enable input terminal coupled to the first input terminal of the CMOS invertor;
an input logic circuit;
two P-channel field effect transistors, each having a backgate, connected in series between the source terminal and the output terminal, one P-channel field effect transistor connected to the output terminal of the CMOS inverter and the other P-channel field effect transistor connected to the input logic circuit;
a P-channel field effect transistor, having a backgate, connected to the source terminal and connected between the output terminal and the backgate of the P-channel field effect transistors and the CMOS inverter; and
a P-channel field effect transistor, having a backgate, connected to the output terminal and connected between the source terminal and the backgates of the P-channel field effect transistors and the CMOS inverter.

25. A driver as in claim 24 wherein the input logic circuit comprises a NAND gate receiving a logic signal and an enable signal.

26. A method of alternately applying a voltage on a source terminal to an output terminal and isolating the output terminal from the source terminal, comprising the steps of:

generating a backgate voltage substantially equal to a voltage on the output terminal when the voltage on the output terminal exceeds the voltage on the source terminal, and otherwise substantially equal to the voltage on the source terminal;

isolating the output terminal from the source terminal by gating a pullup field effect device, which is backgated by the backgate voltage, with a first gating voltage selected between the voltage on the output terminal and the voltage on the source terminal to be substantially equal to the backgate voltage when a driver off state is indicated at a signal terminal, thereby deactivating the pullup field effect device and isolating the output terminal from the source terminal; and exclusive of the isolating step, applying a voltage on the source terminal to the output terminal by gating the pullup field effect device, which is backgated by the backgate voltage, with a second gating voltage when a driver on state is indicated at the signal terminal, thereby activating the pullup field effect device and connecting the source terminal to the output terminal.

27. The method as in claim 26 wherein the step of isolating the output terminal from the source terminal comprises:

activating a first field effect transistor which is backgated by the backgate voltage, to couple the output terminal to a node when the voltage on the output terminal exceeds the voltage on the source terminal;

activating a second field effect transistor which is backgated by the backgate voltage, in response to the driver off state indicated at the signal terminal to couple a pullup field effect transistor to the node, thereby gating the pullup field effect transistor with the first gating voltage to deactivate the pullup field effect transistor and isolate the output terminal from the source terminal.

28. The method as in claim 26 wherein the step of applying the voltage on the source terminal to the output terminal comprises activating a field effect transistor in response to the driver on state indicated at the signal terminal to couple a pullup field effect transistor to a reference voltage terminal, thereby gating the pullup field effect transistor with the second gating voltage to activate the pullup field effect transistor and connect the source terminal to the output terminal.

29. The method as in claim 26 wherein the step of applying the voltage on the source terminal to the output terminal comprises:

gating a first pullup field effect transistor which is backgated by the backgate voltage, with the second gating voltage when the driver on state is indicated at the signal terminal, thereby activating the first pullup field effect transistor and connecting the source terminal to the output terminal; and activating a field effect transistor in response to the driver on state indicated at the signal terminal to couple a second pullup field effect transistor to a reference voltage terminal, thereby gating the second pullup field effect transistor to activate the second pullup field effect transistor and connect the source terminal to the first pullup field effect transistor.

30. The method as in claim 26 wherein the step of generating a backgate voltage comprises activating a field effect transistor having a backgate, when the voltage on the output terminal exceeds the voltage on the source terminal to couple the output terminal to an output thereof, the output being applied to the backgate.

31. A method of alternately applying a voltage on a source terminal to an output terminal and isolating the output terminal from the source terminal, comprising the steps of:

generating a backgate voltage substantially equal to a voltage on the output terminal when the voltage on the output terminal exceeds the voltage on the source terminal, and otherwise substantially equal to the voltage on the source terminal;

isolating the output terminal form the source terminal by gating a pullup field effect device, which is backgated by the backgate voltage, with a first gating voltage substantially equal to the backgate voltage when a driver off state is indicated at a signal terminal, thereby deactivating the pullup field effect device and isolating the output terminal from the source terminal wherein the step of isolating the output terminal from the source terminal comprises:

gating a first pullup field effect transistor which is backgated by the backgate voltage, with the first gating voltage when the driver off signal is indicated at the signal terminal and the voltage on the output terminal is other than in excess of the voltage on the source terminal, thereby isolating the output terminal from the source terminal; and gating a second pullup transistor which is backgated by the backgate voltage, with the first gating voltage when the driver off signal is indicated at the signal terminal and the voltage on the output terminal exceeds voltage on the source terminal, thereby isolating the output terminal from the source terminal; and exclusive of the isolating step, applying a voltage on the source terminal to the output terminal by gating the pullup field effect device, which is backgated by the backgate voltage, with a second gating voltage when a driver on state is indicated at the signal terminal, thereby activating the pullup field effect device and connecting the source terminal to the output terminal.

32. The method as in claim 31 wherein the step of isolating the output terminal from the source terminal further comprises activating a field effect transistor which is backgated by the backgate voltage, in response to the driver off state indicated at the signal terminal to couple the second pullup field effect transistor to the output terminal, thereby gating the second pullup field effect transistor with the first gating voltage to deactivate the second pullup field effect transistor and isolate the output terminal from the source terminal.

* * * * *

UNITED STATES PATENT AND TRADEMARK OFFICE
CERTIFICATE OF CORRECTION

PATENT NO.: 5,450,025
DATED: September 12, 1995
INVENTOR: Michael J. Shay

It is certified that error appears in the above-identified patent and that said Letters Patent is hereby corrected as shown below:

In Col. 18, line 58 please delete "on" and insert --one--.

Signed and Sealed this

Eighteenth Day of June, 1996

Attest:

BRUCE LEHMAN

Attesting Officer     Commissioner of Patents and Trademarks